United States Patent
Bergmann

(10) Patent No.: US 6,853,113 B2
(45) Date of Patent: Feb. 8, 2005

(54) INTERDIGITAL TRANSDUCER WITH DISTIBUTED EXCITATION

(75) Inventor: Andreas Bergmann, Haiming (DE)

(73) Assignee: EPCOS AG, Munich (DE)

( * ) Notice: Subject to any disclaimer, the term of this patent is extended or adjusted under 35 U.S.C. 154(b) by 7 days.

(21) Appl. No.: 10/220,322

(22) PCT Filed: Feb. 2, 2001

(86) PCT No.: PCT/DE01/00408

§ 371 (c)(1),
(2), (4) Date: Dec. 30, 2002

(87) PCT Pub. No.: WO01/65687

PCT Pub. Date: Sep. 7, 2001

(65) Prior Publication Data

US 2003/0122449 A1 Jul. 3, 2003

(30) Foreign Application Priority Data

Feb. 29, 2000 (DE) .......................... 100 09 517

(51) Int. Cl.[7] .............................. H01L 41/08
(52) U.S. Cl. .............................. 310/313 D; 310/313 B; 310/313 C
(58) Field of Search .................. 310/313 B, 313 C, 310/313 D, 313 R; 333/151–154, 193–196

(56) References Cited

U.S. PATENT DOCUMENTS

| | | | |
|---|---|---|---|
| 4,006,438 A | | 2/1977 | Bennett |
| 4,223,284 A | | 9/1980 | Inoue et al. |
| 4,321,567 A | | 3/1982 | Sandy |
| 5,818,146 A | * | 10/1998 | Kurahashi et al. ...... 310/313 R |
| 5,821,834 A | * | 10/1998 | Xu et al. .................... 333/193 |
| 5,932,950 A | * | 8/1999 | Yamada et al. ......... 310/313 D |
| 6,531,937 B2 | * | 3/2003 | Kadota et al. .............. 333/193 |

* cited by examiner

Primary Examiner—Mark Budd
(74) Attorney, Agent, or Firm—Fish & Richardson P.C.

(57) ABSTRACT

An interdigital transducer for a surface acoustic wave includes an acoustic track with a width of $BS_{ges}$ and subtransducers arranged adjacent to each other on the acoustic track and connected in series. The subtransducers include, in a transverse direction, n series subtransducers each having a track width of $BS_{xi}$ (i=1, 2, . . . n(x); n (x)≧2). In the subtranducers $$BS_{ges} = \sum_{i=1}^{n} BS_{xi},$$

$BS_{xi}$ does not equal $BS_{(x+1)i}$.

25 Claims, 3 Drawing Sheets

INTERDIGITAL TRANSDUCER WITH DISTIBUTED EXCITATION

CROSS-REFERENCE TO RELATED APPLICATIONS

This application claims priority to PCT Application No. PCT/ DE01/00408, filed on Feb. 2, 2001, and to German Patent Application No. 100 09 517.8, filed on Feb. 29, 2000.

FIELD OF THE INVENTION

This invention relates to an interdigital transducer, in particular, for a surface acoustic wave filter (SAW filter) to be used in a wireless communications transmitter.

BACKGROUND

The transmitter and receiver filters in wireless communications transmitters, in particular those in cellular phones, require filters with a precisely defined transfer function. In particular, such a filter should have a sufficiently wide transmission band with low insertion loss and steep edges. The suppression of spurious signals outside the transmission band, that is selectivity, should be sufficiently high.

There are other problems associated with the actual construction of suitable filters. Normally, the selection of the substrate material for the surface acoustic wave filter is determined and/or influenced by the desired temperature coefficients and the volume of the electro-acoustical coupling. Also, increasing miniaturization forces a limitation of the available chip area. This, in turn, often means that a desired transfer function for the filter on a limited chip area can only be achieved by using a certain filter technology. Since the selection of the substrate also determines the coupling coefficient, the possibility to influence transducer impedance is low. However, the selection of a suitable filter impedance is very important for the filter's circuit environment and in particular for certain applications. For example, too low filter impedance in a converter with an open collector output results in increased power consumption and, consequently, in increased battery use and shorter operating time in equipment independent of wall power too.

In order to set a desired transfer function, the interdigital transducer must be weighted. Overlap weighting results in reduced overlap time, entailing increased diffraction and resultant transfer losses. In withdrawal weighted transducers, a number of locally divided small overlaps—like in overlap weighting—are replaced by overlaps whose excitation output is uniform throughout the entire transducer. This results, however, in an approximation error, which causes, especially in transducers with large time-bandwidth products, the response of the withdrawal-weighted transducer to deviate substantially from the desired transfer function at continuous weighting.

Another problem is high performance, which, it is true, results in optimal transfer characteristics in connection with narrow tolerance adapter components, though it makes these characteristics sensitive to fluctuations in the adapter components. In particular, broadband filters with high edge steepness show high performance because the actual transducer admittance component of these filters is small.

To increase transducer impedance on a given substrate material, the aperture can be decreased. However, if this is done, surface wave diffraction is increased, thus lowering the achievable edge steepness. Transducer impedance can also be adjusted by utilizing different phase relationships of overlapping partial waves. However, this cannot be done without influencing the reflectivity of SPUDT cells, which are increasingly used in filters. Another possibility to increase transducer impedance consists of lowering the sampling rate. The result of this procedure, however, is to excite higher harmonics, thus worsening selection in the stop band. In withdrawal-weighted transducers, a reduced sampling rate also makes it more difficult to precisely approximate the desired weighting function.

To decrease the approximation error of the withdrawal weighting, it can be combined with overlap weighting, which in turn, however, results in increased diffraction. Using voltage weighting, that is capacitive voltage division, excitation can be reduced in the transducer's subsections without shortening overlap length, thus reducing the influence of diffraction. In this manner, sampling rate can be increased and approximation error lowered in withdrawal-weighted transducers. However, the voltage weighting for the capacitive voltage division requires an additional transducer used only as capacitance. But this requires additional chip area and generates transfer losses.

The frequency characteristics of a filter with high performance transducers can only be achieved with very precise and consequently costly adapter components with low tolerances. An increase in tolerance is only possible if the ripple factor of the transmission band is set even lower and the edge steepness even higher, so that even the desired requirements can still be met despite fluctuating electrical adjustment. However, the above always entails a larger time-bandwidth product and is can only be achieved on an enlarged chip area.

SUMMARY

The purpose of the present invention is to provide a transducer having the desire line transfer characteristic which largely avoids the above-mentioned disadvantages.

This purpose is solved according to the invention using an interdigital transducer according to claim 1. Advantageous embodiments of the invention are contained in the dependent claims.

The invention is based on the idea known in the art of increasing the impedance of an interdigital transducer, at least in part, by using individual transducers connected in series. According to the invention, this measure is used to divide the interdigital transducer into a plurality of subtransducers arranged adjacently inside the acoustic track, and to replace these subtransducers by series subtransducers connected in series. The division into series subtransducers varies across the whole interdigital transducer so that the track widths of the series subtransducers are different from one subtransducer to the next. This way it is possible to distribute series subtransducers over the interdigital transducer with different voltages and consequently different excitation levels in a desired fashion, while at the same time raising the interdigital transducer's total impedance.

Using the above method, the impedance of a (sub) transducer can be increased by factor $n^2$ if it is divided (transversally) into n series subtransducers having the standardized aperture $1/n$ and these subtransducers are electrically connected in series. This division can be performed using electrically unconnected and therefore floating electrode combs which overlap with the adjacent electrode comb. Due to the fact that n−1 additional electrode combs are needed for a quantity n of series subtransducers, in the case of an even-number n and symmetrical operation, it is also possible to set the center additional transducer combs to ground potential and to thus operate the transducer symmetrically.

The transverse profile of the excited wave and the corresponding transducer pulse response are constant with uniform distribution, with the exception of the additional transverse gaps and the electrode comb connectors, which cannot overlap and therefore do not contribute to excitation.

The transducer's pulse response can be precisely influenced by dividing a transducer into different series subtransducers connected in series. Since excitation is proportional to applied voltage and this increases with decreasing aperture and/or decreasing distance between the two busbars and/or electrode combs, series subtransducers with large apertures will produce lower excitation per overlap than in series subtransducers with smaller apertures. In comparable finger arrangements, the aperture is proportional to the track width of a series subtransducer.

The division into series subtransducers can take the form of all of the series subtransducers of a subtransducer having the same length. Accordingly, the division of the entire interdigital transducer into subtransducers can take the form of all subtransducers having the same length.

It is, however, also possible for the electrode combs within a subtransducer to have different lengths.

In another embodiment of the invention, the interdigital transducer comprises two groups of subtransducers connected in parallel, wherein the groups are connected in series. The above can be achieved, for example, by the outer busbar being divided into sub-busbars and by different potentials being applied to them. The division of subtransducers into groups connected in series can be symmetrical, so that the interdigital transducer features an axis of symmetry between the two sub-busbars.

The interdigital transducer can also be configured symmetrically without dividing busbars. The construction preferably provides the inner subtransducers with the highest excitation output. This is achieved in that internal subtransducers preferably located in the center of the interdigital transducer have the lowest number of additional electrode combs and therefore the lowest number of series subtransducers connected in series. Alternatively, subtransducers preferably located in the center of the interdigital transducer are divided into series subtransducers of identical or at least similar track width and for which it applies to outer subtransducers that the track widths of their series subtransducers differ more than those of the inner subtransducers. For subtransducers not located in the center of the interdigital transducer, it preferably applies that the inner series subtransducers are provided with the largest track width. Preferably, the track width distribution of the series subtransducers is symmetrical to a longitudinal axis of symmetry.

Connecting series subtransducers in series also results in reducing their total capacitance. If, for example, a transducer with a static capacity per unit of length $C_1$ is replaced by two transducers connected in series, each of which receives half of the total voltage, the static capacitance per unit of length drops to a value $C_{1s}=C_1/4$. Therefore, each division of a transducer into subtransducers connected in series results, at constant total aperture and/or track width and constant connection finger configuration, in static capacitance being reduced. Since static capacitance is essentially responsible for transducer performance, this also entails reducing performance. Consequently, the interdigital transducer according to the invention provides a higher range of tolerance for the adapter components of a filter.

The invention is described in greater detail below using embodiments and accompanying drawings.

DETAILED DESCRIPTION

Figure 1:
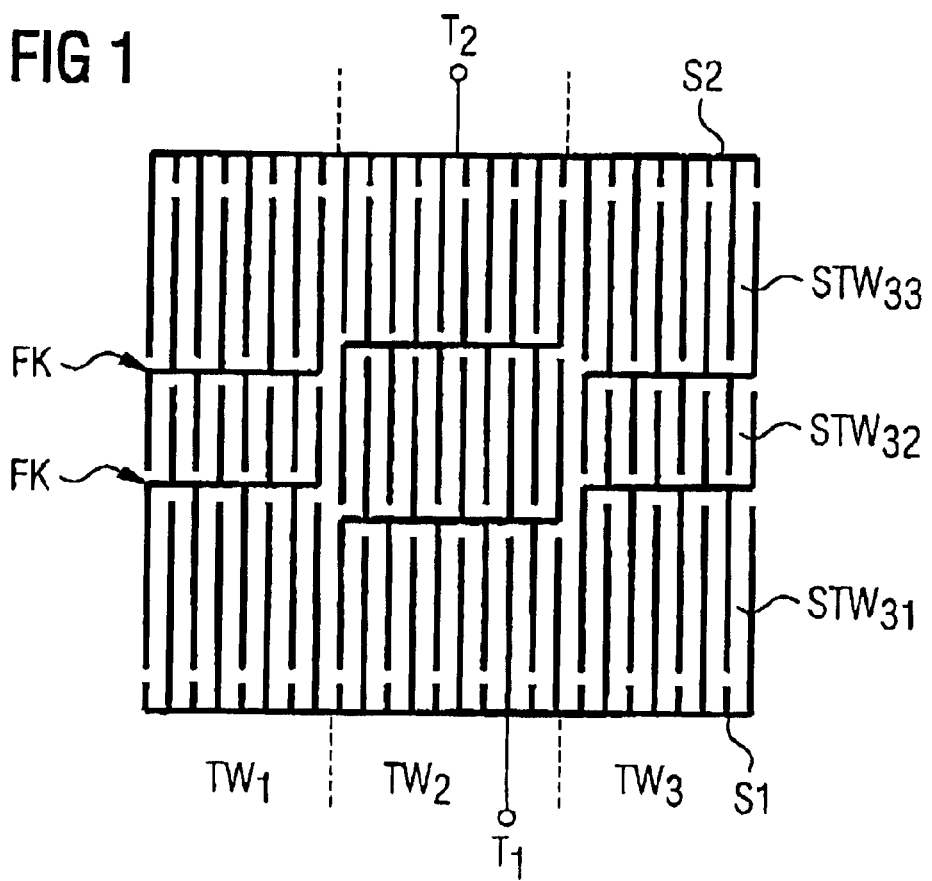
FIG. 1 shows an interdigital transducer according to the invention with three subtransducers

FIG. 1 shows a first interdigital transducer according to the invention, comprised of three subtransducers $TW_1$ through $TW_3$ connected in parallel between two busbars S1 and S2. Each subtransducer $TW_x$ in turn is comprised of three series subtransducers $STW_{x1}$ through $STW_{x3}$ connected in series. The division of subtransducers $TW_x$ into subtransducers $STW_{xi}$ is performed by an interim configuration of floating electrode combs FK, whose electrode combs overlap with the adjacent busbar S or the adjacent electrode comb FK. The terminals of the interdigital transducer according to the invention are labeled $T_1$ and $T_2$.

Figure 2:
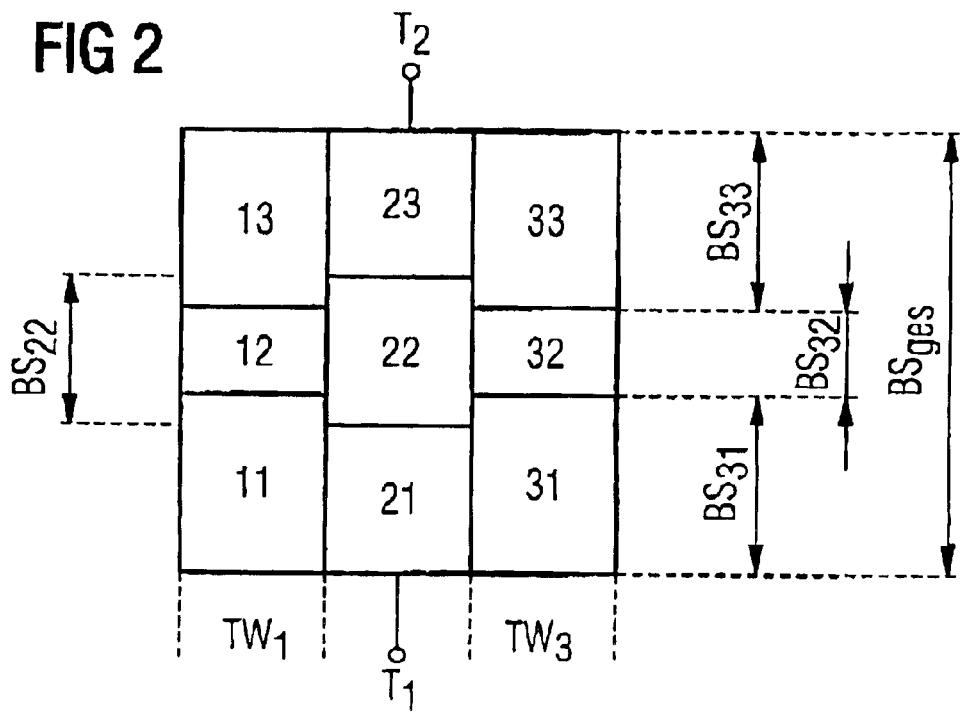
FIGS. 2 and 3 show two additional possibilities for dividing an interdigital transducer into subtransducers using series subtransducers

FIG. 2 again shows a schematic of the division of the interdigital transducer into subtransducers and series subtransducers, wherein only the numbers of corresponding serial subtransducers are entered into the boxes representing the series subtransducers. In this embodiment, the center subtransducer $TW_2$ is divided into three series subtransducers of equal size with the numbers 21, 22 and 23. The initial result of the above is that the impedance of this subtransducer $TW_2$ has 9 times the impedance of an undivided transducer of the same length and same track width BS. As a result of the symmetrical distribution, the same voltage is applied to each series subtransducer STW, which in this case totals ⅓ of the total voltage of subtransducer $TW_2$ for each series subtransducer. Subtransducer $TW_2$ has a total excitation output equaling ⅓ of the excitation output that an undivided transducer with full track width $BS_{ges}$ would show.

The two outer subtransducers $TW_1$ and $TW_3$ both have the same division into series subtransducers STW. The track widths of the series subtransducers labeled 11, 12 and 13 have a ratio of 2:1:2. The subcapacitances $C_{xi}$ also have a corresponding ratio for subtransducer $TW_1$ and $TW_3$, namely 2:1:2. The ratio is almost inverted for the ratio of the voltages applied to the series subtransducers, that is 1:2:1 for the series subtransducers of the subtransducers $TW_1$ and $TW_3$. In this division, all series subtransducers STW of the subtransducers $TW_1$ and $TW_3$ receive the same excitation output, which in this case is 1/10 of the excitation output that a subtransducer with track width $BS_{ges}$ would show. The total excitation for the subtransducers $TW_1$ and $TW_3$ therefore equals 3/10, while the subtransducer $TW_2$ receives ⅓ of the excitation output of an undivided transducer with full track width $BS_{ges}$.

Figure 3:
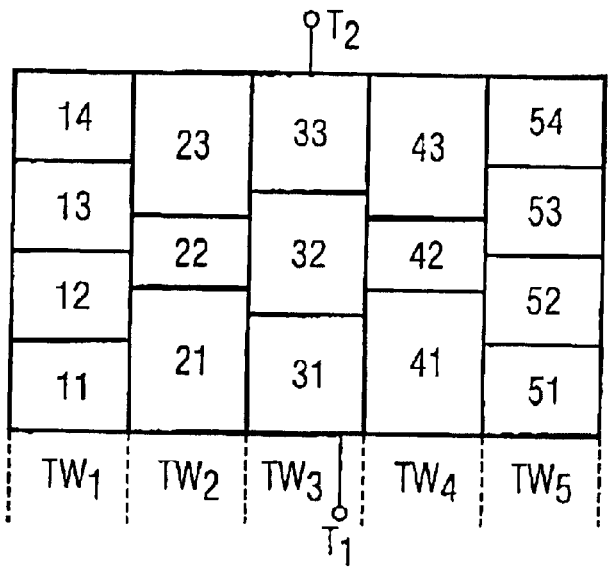

FIG. 3 shows schematically the division of an interdigital transducer according to the invention into a total of five subtransducers $TW_x$, each of which is divided into three or four series subtransducers $STW_{x1}$. Here too a symmetrical division has been selected, wherein the center subtransducer TW$_3$ receives the highest excitation output, while the outer subtransducers TW$_1$ and TW$_5$ receive the lowest. The relative excitation output of each of the series subtransducers of the subtransducers TW$_2$ and TW$_4$ is approximately 2/27 of the excitation of an undivided transducer with full track width BS$_{ges}$. With relative track width ratios of 4:1:4, the series subtransducers of the subtransducers TW$_2$ and TW$_4$ show a voltage ratio of 1:4:1. In this division, therefore, each series subtransducer STW$_{xi}$ inside a subtransducer TW$_x$ receives the same excitation output. Integrated into each subtransducer, this results in the following excitations of the subtransducers relative to the maximum possible [excitation]: 3/9 (TW$_3$), 2/9 (TW$_2$ or TW$_4$) and 1/4 (TW$_1$ and TW$_5$).

In another embodiment of the invention, the floating electrode combs FK of the outer subtransducers are moved in such a way that the center series subtransducers inside these subtransducers show the lowest track width. These [subtransducers] receive the largest voltage drop and therefore the highest relative excitation output. However, for the excitation output integrated over the entire track length BS$_{ges}$ of the subtransducers, an uneven distribution in the series subtransducers produces a lower total excitation.

Figure 4:
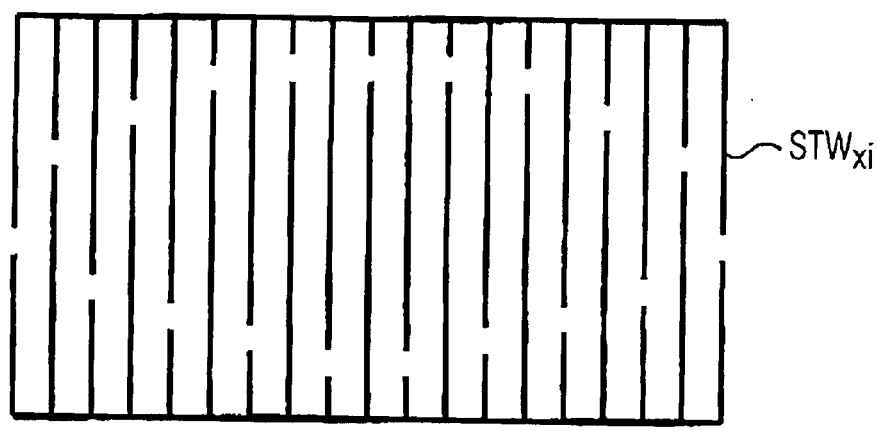
FIGS. 4 through 6 show different structures for subtransducers and series subtransducers

FIG. 4 shows a schematic of how a weighted series subtransducer can be part of an interdigital transducer according to the invention. The series transducer is provided with an overlap weighting with the largest weightings in the center and the smallest on the edge of the series subtransducer.

Figure 5A:
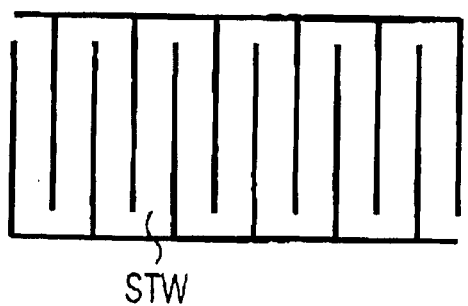
Figure 5B:
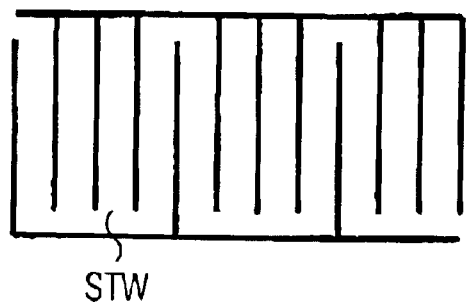

FIG. 5a shows a non-weighted subtransducer with normal finger configuration, while 5b shows a subtransducer with withdrawal weighing. Compared to the configuration in FIG. 5a, every other finger of a busbar is rotated and is assigned to the opposite busbar so that it does not contribute to overlap. Using this measure reduces the capacitance of the series subtransducer in FIG. 5b by half of that shown in FIG. 5a.

Figure 6:
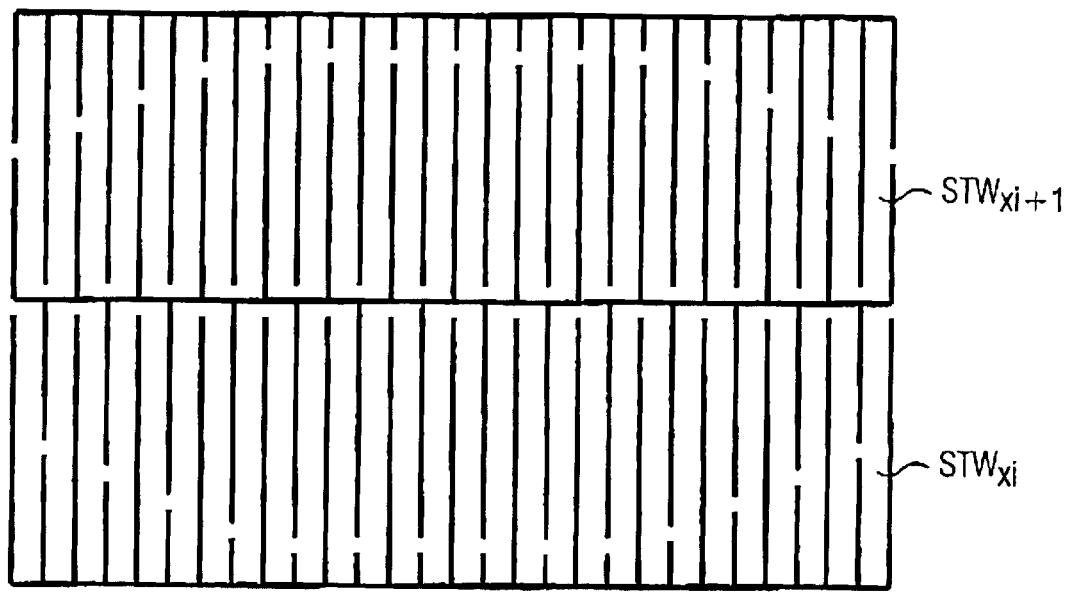

FIG. 6 shows a possible way to distribute the desired weighting between two adjacent series subtransducers STW$_{xi}$ and STW$_{xi+1}$. The selected weighting method is overlap weighting, with the largest weights also being placed in the center of the series subtransducer here, while the smallest weights are placed at the edges of the subtransducers.

Figure 7:
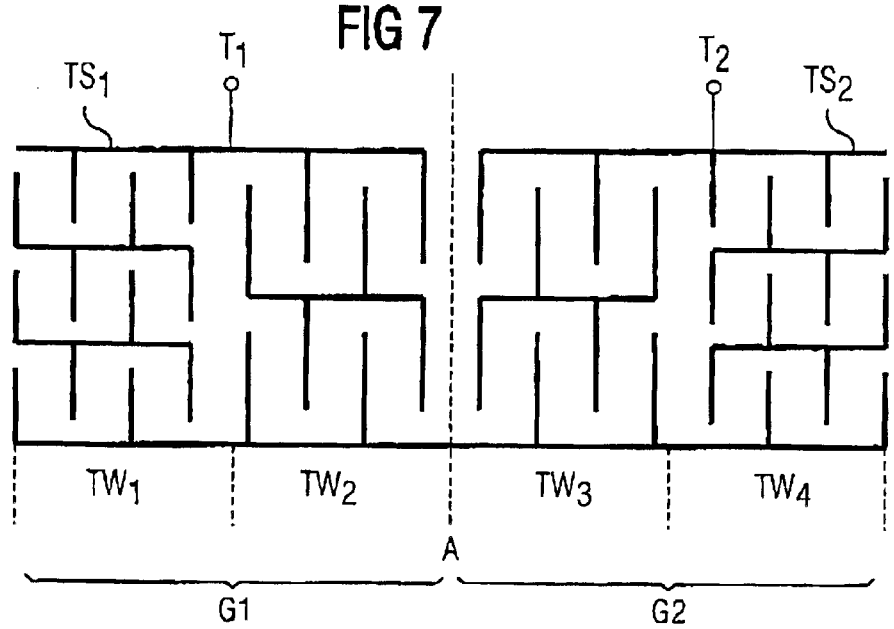
FIG. 7 shows the connection in series of two groups of subtransducers connected in parallel with series subtransducers connected in series The drawings are only meant to provide a better understanding of the invention, and are therefore not drawn to a single scale nor are true to scale.

FIG. 7 shows another interdigital transducer according to the invention, in which two groups G1 and G2, each consisting of two subtransducers connected in parallel, are connected in series. This is achieved by dividing a busbar into sub-busbars TS$_1$ and TS$_2$ and by symmetrically configuring the subtransducers and the series subtransducers with respect to a symmetrical axis A running between the two sub busbars TS$_1$ and TS$_2$. The connection in series increases the interdigital transducer's impedance by a factor of 8 compared to an interdigital transducer, in which the two groups G1 and G2 are connected in parallel to each other.

The sample embodiments only provide examples of how the invention can be embodied. Consequently, the invention is not restricted to them. Dividing an interdigital transducer into a large number of subtransducers also falls within the scope of the invention. The number of series subtransducers per subtransducer is also variable, as is the relative track width of the series subtransducers to each other within a subtransducer. That means it is possible to divide excitation in a desired way across the interdigital transducer, to set the impedance as desired and, at the same time, to duplicate the excitation function, which guarantees the desired transfer characteristics for the transducer and/or a filter with this interdigital transducer. As the interdigital transducer according to the invention can also be used to raise the transducer's impedance and lower its performance, it also avoids the disadvantages of the known solutions mentioned at the beginning. It also manages to further reduce the amount of chip area required for an interdigital transducer, and therefore the area required for a filter, without degrading its characteristics.

What is claimed is:

1. An interdigital transducer for a surface acoustic wave component, the interdigital transducer comprising:

an acoustic track having a width of BS$_{ges}$; and m (m≧2) subtransducers arranged adjacent to each other on the acoustic track and connected in parallel;

wherein each of the m subtransducers comprises n series subtransducers each having a track width of BS$_{xi}$ (x=1 ... m, i=1 ... n);

wherein:

$$BS_{ges} = \sum_{i=1}^{n} BS_{xi},$$

and

BS$_{xi}$ does not equal BS$_{(x+1)i}$ for at least two series subtransducers; and wherein at least one of the m subtransducers further comprises floating electrode combs having different lengths that divide the n series subtransducers.

2. The interdigital transducer of claim 1, wherein the interdigital transducer comprises a split finger transducer.

3. The interdigital transducer of claim 1, wherein at least two of the m subtransducers comprise different numbers of series subtransducers.

4. An interdigital transducer for a surface acoustic wave component, the interdigital transducer comprising:

an acoustic subtrack having a width of BS$_{ges}$; and m (m≧2) subtransducers arranged adjacent to each other on the acoustic subtrack and connected in parallel;

wherein each of the m subtransducers comprises n series subtransducers each having a track width of BS$_{xi}$ (x=1 ... m, i=1 ... n);

wherein:

$$BS_{ges} = \sum_{i=1}^{n} BS_{xi},$$

and

BS$_{xi}$ does not equal BS$_{(x+1)i}$ for at least two series subtransducers; and wherein the m subtransducers comprise a first group of subtransducers, the first group of subtransducers being connected in series to a second group of subtransducers that are connected in parallel and that are arranged on same acoustic track as the first group of subtransducers.

5. The interdigital transducer of claim 4, wherein at least two of the m subtransducers comprise different numbers of series subtransducers.

6. The interdigital transducer of claim 4, wherein the first and second groups of subtransducers are defined by an outer busbar dividing the acoustic track into two or more subtracks; and wherein the interdigital transducer further comprises terminals that are connected to different ones of the two or more subtracks.

7. The interdigital transducer of claim 6, which is symmetric with respect to an axis of symmetry transversely dividing the subtracks.

8. An interdigital transducer for a surface acoustic wave component, the interdigital transducer comprising:

an acoustic track having a width of $BS_{ges}$; and m (m≧2) subtransducers arranged adjacent to each other on the acoustic track and connected in parallel;

wherein each of the m subtransducers comprises n series subtransducers each having a track width of $BS_{xi}$ (x=1 . . . m, i=1 . . . n);

wherein:

$$BS_{ges} = \sum_{i=1}^{n} BS_{xi},$$

and $BS_{xi}$ does not equal $BS_{(x+1)i}$ for at least two series subtransducers; and wherein the interdigital transducer comprises a recursive transducer with divided reflection.

9. The interdigital transducer of claim 8, wherein at least one of the m subtransducers comprises floating electrode combs that divide the n series subtransducers.

10. The interdigital transducer of claim 8, wherein the interdigital transducer comprises a split finger transducer.

11. The interdigital transducer of claim 8, wherein at least two of the m subtransducers comprise different numbers of series subtransducers.

12. An interdigital transducer for a surface acoustic wave component, the interdigital transducer comprising:

an acoustic track having a width of $BS_{ges}$; and m (m≧2) subtransducers arranged adjacent to each other on the acoustic track and connected in parallel;

wherein each of the in subtransducers comprises n series subtransducers each having a track width of $BS_{xi}$ (x=1 . . . m, i=1 . . . n);

wherein:

$$BS_{ges} = \sum_{i=1}^{n} BS_{xi},$$

and $BS_{xi}$ does not equal $BS_{(x+1)i}$ for at least two series subtransducers; and wherein at least one part of the n series subtransducers in at least one of the m subtransducers includes withdrawal weighting.

13. The interdigital transducer of claim 12, wherein at least one of the m subtransducers further comprises floating electrode combs that divide the n series subtransducers.

14. The interdigital transducer of claim 12, wherein the interdigital transducer comprises a split finger transducer.

15. The interdigital transducer of claim 12, wherein at least two of the m subtransducers comprise different numbers of series subtransducers.

16. An interdigital transducer for a surface acoustic wave component, the interdigital transducer comprising:

an acoustic track having a width of $BS_{ges}$; and m (m≧2) subtransducers arranged adjacent to each other on the acoustic track and connected in parallel;

wherein each of the m subtransducers comprises n series subtransducers each having a track width of $BS_{xi}$ (x=1 . . . m, i=1 . . . n);

wherein:

$$BS_{ges} = \sum_{i=1}^{n} BS_{xi},$$

and $BS_{xi}$ does not equal $BS_{(x+1)i}$ for at least two series subtransducers; and wherein at least one part of the n series subtransducers in at least one of the m subtransducers includes overlap weighting.

17. The interdigital transducer of claim 16, wherein the interdigital transducer comprises a split finger transducer.

18. The interdigital transducer of claim 16, wherein at least two of the m subtransducers comprise different numbers of series subtransducers.

19. An interdigital transducer for a surface acoustic wave component, the interdigital transducer comprising:

an acoustic track having a width of $BS_{ges}$; and m (m≧2) subtransducers arranged adjacent to each other on the acoustic track and connected in parallel;

wherein each of the m subtransducers comprises n series subtransducers each having a track width of $BS_{xi}$ (x=1 . . . m, i=1 . . . n);

wherein:

$$BS_{ges} = \sum_{i=1}^{n} BS_{xi},$$

and $BS_{xi}$ does not equal $BS_{(x+1)i}$ for at least two series subtransducers; and wherein the m subtransducers, and the series subtransducers within each of the m subtransducers, are arranged symmetrically.

20. The interdigital transducer of claim 19, wherein at least two of the m subtransducers comprise different numbers of series subtransducers.

21. An interdigital transducer for a surface acoustic wave component, the interdigital transducer comprising:

an acoustic track having a width of $BS_{ges}$; and m (m≧2) subtransducers arranged adjacent to each other on the acoustic track and connected in parallel;

wherein each of the m subtransducers comprises n series subtransducers each having a track width of $BS_{xi}$ (x=1 . . . m, i=1 . . . n);

wherein:

$$BS_{ges} = \sum_{i=1}^{n} BS_{xi},$$

and $BS_{xi}$ does not equal $BS_{(x+1)i}$ for at least two series subtransducers; and wherein an excitation at a center of the interdigital transducer is greater than an excitation at an edge of the interdigital transducer.

22. The interdigital transducer of claim 21, wherein at least two of the m subtransducers comprise different numbers of series subtransducers.

23. An interdigital transducer for a surface acoustic wave component, the interdigital transducer comprising:

an acoustic track having a width of $BS_{ges}$; and m (m≧2) subtransducers arranged adjacent to each other on the acoustic track and connected in parallel;

wherein each of the m subtransducers comprises n series subtransducers each having a track width of $BS_{xi}$ (x=1 . . . m, i=1 . . . n);

wherein:

$$BS_{ges} = \sum_{i=1}^{n} BS_{xi},$$

and $BS_{xi}$ does not equal $BS_{(x+1)i}$ for at least two series subtransducers;

wherein subtransducers that are internal to the interdigital transducer are more evenly divided into series subtransducers than subtransducers that border an exterior of the interdigital transducer; and wherein a product $$\prod_{i} BS_{xi}$$

of track widths of series subtransducers associated with an internal subtransducer with m>x>1, is larger than a product $$\prod_{i} BS_{xi}$$

of track widths of series subtransducers associated with a subtransducer with x=1 or m that borders the exterior of the interdigital transducer.

24. The interdigital transducer of claim 23, wherein a series subtransducer that is in a subtransducer that borders the exterior of the interdigital transducer and that has n>i>1 has a smallest track width.

25. The interdigital transducer of claim 23, wherein at least two of the m subtransducers comprise different numbers of series subtransducers.

* * * * *

UNITED STATES PATENT AND TRADEMARK OFFICE
CERTIFICATE OF CORRECTION

PATENT NO.   : 6,853,113 B2
DATED        : February 8, 2005
INVENTOR(S)  : Andreas Bergmann It is certified that error appears in the above-identified patent and that said Letters Patent is hereby corrected as shown below:

Column 6,
Line 16, after the words "each of the" delete "in", replace with -- m --.
Line 56, after the words "wherein the" delete "in", repalce with -- m --.
Line 59, after the words "arranged on", add -- a --.

Column 7,
Line 41, after the words "each of the" delete "in", replace with -- m --.

Column 10,
Line 8, after "m>x>1", delete ","

Signed and Sealed this

Second Day of August, 2005

JON W. DUDAS
*Director of the United States Patent and Trademark Office*